United States Patent
Donges

(10) Patent No.: US 6,234,379 B1
(45) Date of Patent: May 22, 2001

(54) NO-FLOW FLUX AND UNDERFILL DISPENSING METHODS

(75) Inventor: William E. Donges, Wellington, OH (US)

(73) Assignee: Nordson Corporation, Westlake, OH (US)

(*) Notice: Subject to any disclaimer, the term of this patent is extended or adjusted under 35 U.S.C. 154(b) by 0 days.

(21) Appl. No.: 09/514,602

(22) Filed: Feb. 28, 2000

(51) Int. Cl.[7] .................. B23K 1/20; B23K 3/00
(52) U.S. Cl. ............... 228/207; 228/180.22; 228/209
(58) Field of Search .................. 228/207, 180.22, 228/209; 438/108; 29/841

(56) References Cited

U.S. PATENT DOCUMENTS

| | | | |
|---|---|---|---|
| 5,328,085 | * 7/1994 | Stoops et al. | |
| 5,747,102 | 5/1998 | Smith et al. | ............ 427/96 |
| 5,985,456 | * 11/1999 | Zhou et al. | |
| 5,988,485 | * 11/1999 | Master et al. | |

OTHER PUBLICATIONS

Emerson & Cuming, *No Flow–Fluxing Underfill Encapsulants*, Brochure, undated.

* cited by examiner

Primary Examiner—Patrick Ryan
Assistant Examiner—Jonathan Johnson
(74) Attorney, Agent, or Firm—Wood, Herron & Evans, L.L.P.

(57) ABSTRACT

A method for attaching a semiconductor die or flip chip to a substrate to form a printed circuit board. A dispensing apparatus is spaced away from a substrate so that the dispenser does not contact the substrate. Droplets of no-flow flux and underfill material are dispensed from the dispensing apparatus onto a substrate. A flip chip with an array of solder balls or bumps on its underside is push through the material until it contacts the substrate. The flip chip and the substrate are heated sufficiently to form mechanical and electrical connections therebetween. The method of the present invention can apply the no-flow flux and underfill material in a predetermined pattern. Furthermore, the predetermined pattern of droplets can be tailored to also include a desired topography. That is, the height of the no-flow flux and underfill material can vary relative to the substantially flat surface of the substrate.

9 Claims, 2 Drawing Sheets

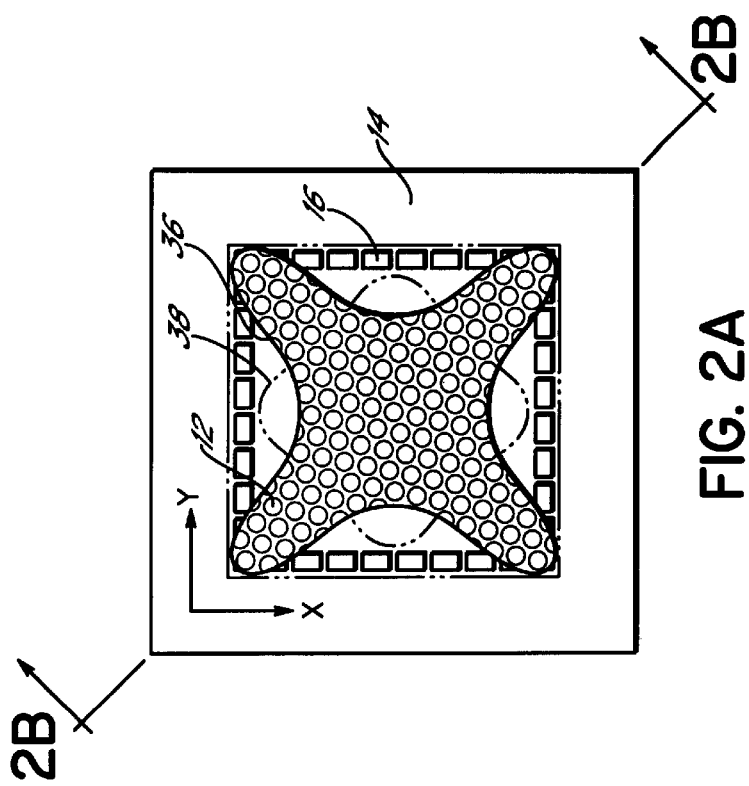
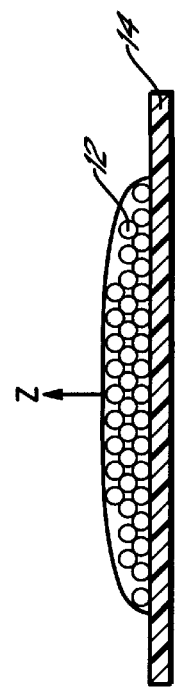
FIG. 2A
FIG. 2B
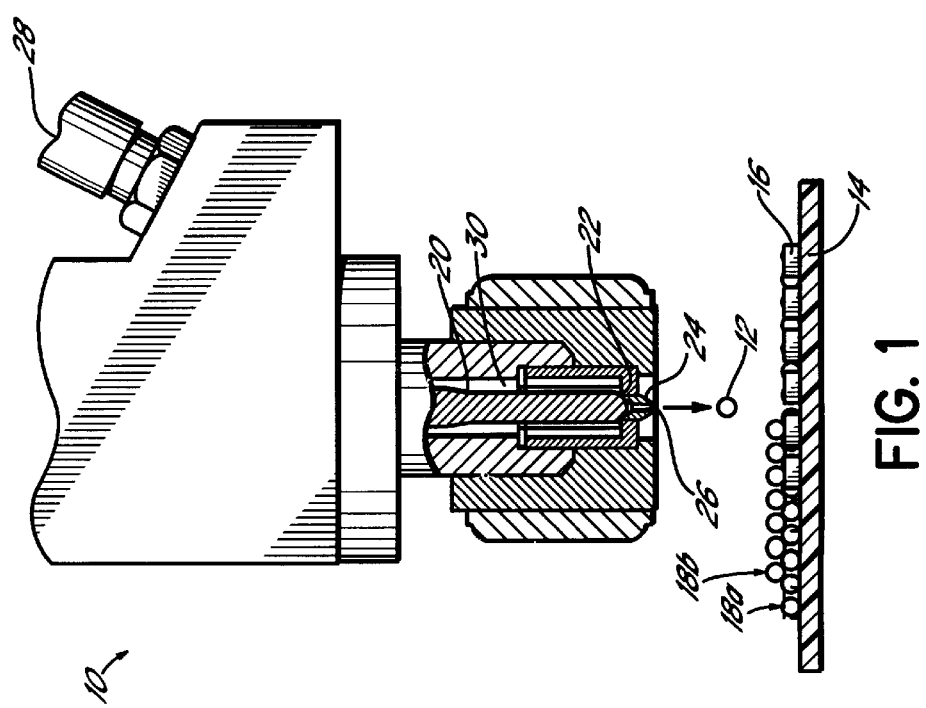
FIG. 1

NO-FLOW FLUX AND UNDERFILL DISPENSING METHODS

FIELD OF THE INVENTION

The present invention generally relates to methods for dispensing no-flow flux and underfill, and more specifically, to dispensing no-flow flux and underfill during the application of a flip chip to a substrate.

BACKGROUND OF THE INVENTION

A printed circuit (PC) board generally comprises numerous electrical components mounted to a substrate. Two common types of components are the lead frame component and the flip chip, both of which can be mounted by different techniques to the substrate. As the name suggests, the lead frame component is connected to the substrate via individual wires extending from the substrate and connecting to the leads of the lead frame component. In contrast, the flip chip is connected to the substrate without the use of any wire connectors. For smaller and smaller electrical components, the flip chip is preferred because it is more easily attached to the substrate than the lead frame component using wire connections.

A flip chip generally has an array of solder balls or bumps affixed to the underside or image side of the flip chip. The substrate has complementary interconnect or solder pads registered to align with the solder balls. To attach the flip chip to the substrate, a flux is applied to the substrate. The flip chip is then placed onto the substrate such that the solder balls rest upon the solder pads. With the flip chip resting upon the substrate, the entire PC board is heated until the solder balls reflow to mechanically and electrically connect the flip chip to the substrate. The PC board is then removed from the heat and an underfill material is inserted in the gap between the flip chip and the substrate. After the underfill material is deposited into the gap, the entire PC board is again reheated in order to cure, i.e., fix, the underfill material.

Typically, the underfill material is highly flowable and is deposited onto the substrate next to the flip chip and allowed to wick, via capillary action, into the gap between the flip chip and the substrate. To facilitate this underfill process, the underfill material is dispensed through a needle positioned very close to the substrate surface and directly next to the flip chip itself. The height of the dispensing needle is critical to the proper placement of the underfill material between the flip chip and the substrate. To be most effective, the underfill material dispensed from the dispensing needle must make contact with the substrate while it continuously discharges from the dispensing needle. Consequently, the dispense needle tip must be very close to the substrate surface. To achieve this minimum spacing between the dispense needle tip and the substrate, a height sensor must be employed. Typically, a height sensor is placed directly onto the substrate as the underfill material is dispensed from the dispensing needle. The height sensor contacting the substrate surface can cause deflection of the substrate. If severe enough, the deflection may cause height sensing errors such that the needle is incorrectly positioned relative to the substrate. For example, the deflection may cause the needle to be positioned too low and may even contact the substrate.

To ensure that wicking draws the flowable underfill into the gap, the dispense needle must be positioned extremely close to the edge of the chip so that the dispensed material contacts the edge of the flip chip. Consequently, if the needle is incorrectly positioned because of vision errors with the positioning system or if the needle is bent because of contact with the substrate, the needle may contact the edge of the chip. This contact may damage the edge of the chip, especially near the corner of the flip chip.

To alleviate some of the problems associated with using flowable underfills after the flip chip is already attached to the substrate, no-flow flux and underfill mixtures may be employed. However, to use the no-flow flux and underfill, a different application process must be used. For instance, prior to placing the flip chip onto the substrate, a dispense needle dispenses a predetermined amount of no-flow flux and underfill material onto the designated array of solder pads. Once the no-flow flux and underfill is dispensed onto the substrate, the flip chip is pushed down into the no-flow flux and underfill material until the solder balls contact the solder pads. The PC board is then heated until the solder balls reflow to mechanically and electrically connect with the solder pads. During the heating step, the flux component assists in soldering the flip chip to the substrate. In addition, the underfill material is cured and no subsequent reflowing is required. By using this mixture of no-flow flux and underfill, the additional heating step normally required to cure the underfill material is eliminated. Consequently, the manufacturing process of the printed circuit boards is much faster, less complicated and more efficient.

However, the use of the dispense needle to apply the no-flow flux and underfill material to the substrate prior to applying the flip chip has disadvantages. As explained above, any time underfill material is dispensed from a dispense needle, the dispense needle must remain relatively close to the substrate surface. This requires that a height sensor be used to maintain the proper distance between the tip of the dispense needle and the substrate surface. As discussed above, the contact force of the height sensor may damage the substrate surface. In addition, the topography of the no-flow flux and underfill material relative to the surface of the substrate cannot be controlled or tailored. That is, the dispense needle must remain at a relatively constant height above the substrate as it dispenses the no-flow flux and underfill. It is critical to the proper placement and function of the flip chip that no voids or air pockets be introduced between the flip chip and the substrate during the application process. Without the ability to produce a tailored topography of the no-flow flux and underfill material as it is applied to the substrate, undesirable voids or air pockets may be formed between the flip chip and the substrate.

A method is therefore needed for depositing no-flow flux and underfill material for flip chip attachment onto a substrate in which the dispensing apparatus does not physically contact the substrate. In addition, it would be advantageous for the method to allow tailoring the topography of the no-flow flux and underfill material as it is applied to the substrate. Such height tailoring will minimize voids and air pockets between the flip chip and the substrate.

SUMMARY OF THE INVENTION

The present invention is generally directed to a method for attaching a semiconductor die or flip chip to a substrate to form a printed circuit board. Therefore, in accordance with the principles of the present invention, the outlet of a dispensing apparatus is spaced away from a substrate so that the dispenser does not contact the substrate. Next, droplets of no-flow flux and underfill material are dispensed from the dispensing apparatus onto the substrate. These droplets are discrete units which can be placed with great precision compared to the continuous stream of material which flows from a needle dispense apparatus. The dispensing apparatus moves relative to the substrate to form a predetermined, precise pattern of droplets on the surface of the substrate. Once the no-flow flux and underfill material has been applied, a flip chip with an array of solder balls or bumps on its underside is pushed through the material until it contacts the substrate. More specifically, the solder balls are aligned with a complementary array of solder pads located on the surface of the substrate so that the solder balls contact the solder pads. To permanently affix the flip chip to the substrate, the flip chip and the substrate are heated sufficiently to form mechanical and electrical connections therebetween. The solder balls reflow, i.e., soften, and physically bond with the solder pads on the surface of the substrate.

Advantageously, the method of the present invention can apply the no-flow flux and underfill material in a predetermined pattern yielding efficient use of the material and uniform filling of the space between the flip chip and the substrate. The predetermined pattern of droplets can be tailored to also include a desired topography or contoured height profile. That is, the height of the no-flow flux and underfill material can vary relative to the substantially flat surface of the substrate. In the preferred embodiment, the height profile varies from a maximum height near the center of the substrate to a minimum height at a radially outer point relative to the center. For square chips, an X-shaped pattern of droplets is preferred, although other patterns may be used as well. The topography and/or pattern shape can be specifically tailored to a particular flip chip configuration to help minimize, if not eliminate, undesirable voids and air pockets between the flip chip and the substrate.

Various additional advantages, objects and features of the invention will become more readily apparent to those of ordinary skill in the art upon consideration of the following detailed description of the presently preferred embodiments taken in conjunction with the accompanying drawings.

DETAILED DESCRIPTION OF DRAWINGS

FIG. 1 is a cross-sectional view of a dispensing apparatus depositing no-flow flux and underfill onto a substrate;

FIG. 2A is top view showing a patterned application of the no-flow flux and underfill applied to the substrate;

FIG. 2B is a cross-sectional view of the substrate and no-flow flux and underfill taken along line 2B—2B of FIG. 2A;

DETAILED DESCRIPTION OF PREFERRED EMBODIMENTS

Figure 3:
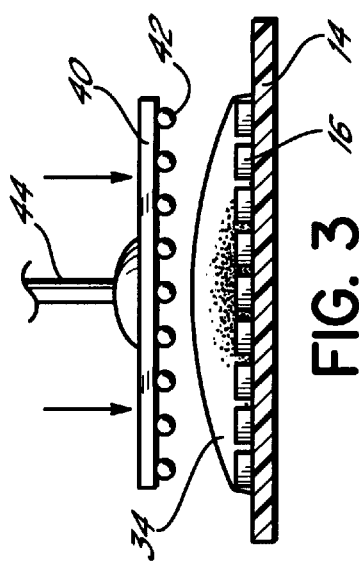
FIG. 3 is an elevational view of the substrate of FIG. 2C receiving a flip chip.
Figure 4:
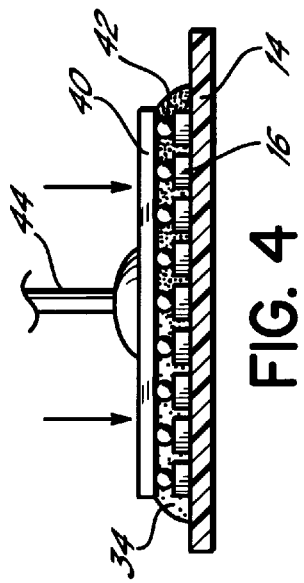
FIG. 4 is an elevational view of the substrate of FIG. 3 with the flip chip fully embedded into the no-flux and underfill.

The present invention provides an efficient method for applying a semiconductor die or flip chip to a printed circuit (PC) board. The method of the present invention applies a no-flow flux and underfill mixture prior to the placement of the flip chip onto the substrate. Consequently, the flip chip/substrate combination need only be heating once to complete the solder process and cure the underfill.

Referring first to FIG. 1, a dispensing apparatus 10 is shown depositing droplets 12 onto a printed circuit (PC) board or substrate 14 with solder pads 16 attached thereto. In accordance with the principles of the present invention, the droplets 12 are a mixture of no-flow flux and underfill (hereinafter "underfill"). The dispensing apparatus 10 is capable of dispensing a series of droplets 12 in rapid succession. In addition, the dispensing apparatus 10 can move relative to the substrate 14 so droplets 12 can be applied to the substrate 14 in any desired pattern. In addition multiple layers of underfill can be applied. As is shown in FIG. 1, a first layer 18a is applied in a desired pattern followed by the addition of an additional layer 18b of underfill droplets 12. Additional layers of underfill may be applied to adjust to the particular application requirements.

The dispensing apparatus 10 includes a valve stem 20 which has a valve head 22 at one end. The valve stem 20 is selectively moveable to permit valve head 22 to engage and disengage a valve seat 24 thereby stopping and starting the fluid flow through nozzle tip 26. The dispensing apparatus 10 further includes an inlet port 28 operably connected to a source of underfill. The inlet port 28 is in fluid communication with a fluid bore 30 in which valve stem 20 resides. To dispense a droplet 10, the valve head 20 is retracted away from the valve seat 24 and underfill flows out of the nozzle tip 26. After a predetermined amount of underfill flows from the nozzle tip 28, the valve head 22 is forced back onto the valve seat 24 and the flow of underfill ceases. A more complete description of the structure and operation of the dispensing apparatus 10 can be found in U.S. Pat. No. 5,747,102, the disclosure of which is fully incorporated herein by reference. Advantageously, the dispensing apparatus 10 can dispense individual droplets 12 at precise locations on the surface of the substrate 14 without ever having to contact the substrate. In addition, the dispensing apparatus 10 can deposit droplets 12 without generating undesirable stringing.

Figure 2C:
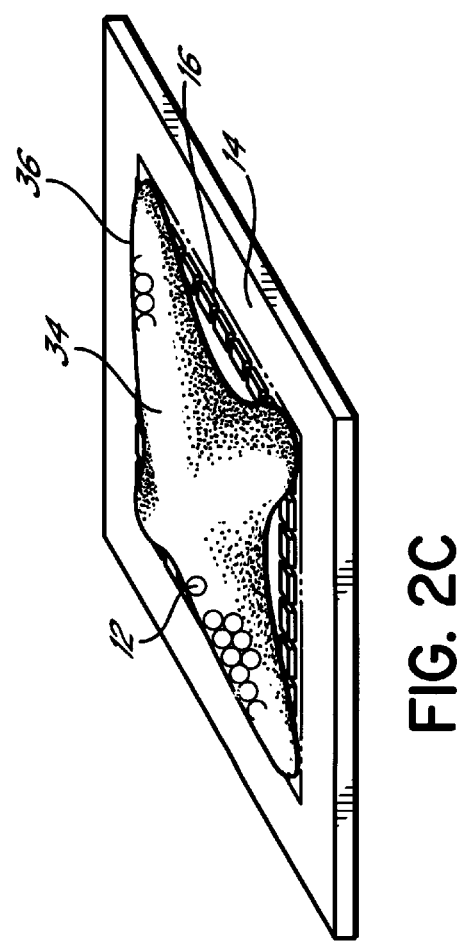
FIG. 2C is a perspective view of the substrate and no-flow flux and underfill.

Because the dispensing apparatus 10 can move relative to the substrate 14, and in reference to FIG. 2A, a desired pattern of underfill material 34 relative to the X-Y coordinate axes can be applied to the substrate to best suit the particular application. Advantageously, additional layers may be applied so that the underfill material 34 can assume a desired height profile in the Z-direction as illustrated in FIGS. 2B and 2C. Because the underfill material 34 has a relatively high viscosity, the individual droplets 18 do not spread out significantly upon making contact with the substrate 14. Consequently, underfill patterns can be tailored in the X,Y, and Z directions. An advantageous underfill pattern shown in FIGS. 2A and 2C has four radially extending arms 36 aligned with the diagonals of a square formed by the solder pads 16 to form a substantially X-shaped pattern on the substrate 14. The topographical or contoured height profile illustrated in FIG. 2C has a maximum height relative to the substrate at the center of the X-shaped pattern. The height of the contoured profile continually decreases from this maximum height along the length of arms 36. Additional arms 38, illustrated as dashed lines in FIG. 2A, may also extend from between arms 36 to provide additional underfill material 34 to the substrate 14. Arms 38 have a similar contoured height profile as arms 36 illustrated in FIG. 2C.

Although the solder pads 16 are illustrated as forming a square (FIG. 2A), the solder pads may be arranged to form a rectangle. Generally, the solder pads 16 would form a rectangle with at length to width ratio of no more than about 2:1. When the solder pads 16 do form a rectangle, the corresponding underfill pattern is elongated such that the arms 36 aligned with the diagonals of the rectangle. In this configuration, arms 38 would likely be used at least along the long side of the rectangle to provide additional underfill material 34 in that region of the substrate 14.

As an alternative to depositing an entire layer of underfill material 34 before proceeding to the disposition of the next layer, the dispensing apparatus 10 can dispense underfill material 34 at a given X-Y coordinate until the required height in the Z-direction is achieved, then moves to another X-Y coordinate until the desired underfill pattern is achieved. In other words, droplets 12 are deposited one on top of the other before the dispensing apparatus 10 moves to a different location above the substrate 14. To that end, some X-Y coordinates may have only one droplet 12, but other X-Y coordinates may have more droplets. For presently contemplated applications, there may be up to six droplets 12.

With reference now to FIG. 3, after the dispensing apparatus 10 deposits the desired underfill pattern onto the substrate 14, a semiconductor die or flip chip 40 is mounted onto the substrate 14. The flip chip 40 includes solder balls or bumps 42 on the underside or image side of the flip chip 40. The solder balls 42 are registered in one-to-one correspondence with the solder pads 16. A transport arm 44 holds the flip chip 40 as the flip chip 40 is pushed into the underfill material until the solder balls 42 contact the solder pads 16. The underfill material 34 with its high viscosity holds the flip chip 40 is place until a heating step is completed.

In order for the flip chip 40 to be mechanically and electrically connected to the substrate, the flip chip 40 and substrate 14 are heated to allow the solder balls 42 to reflow and physically bond with the solder pads 16. This soldering process is assisted by the flux component of the no-flow flux and underfill mixture. During this same heating cycle, the underfill component is cured. The underfill component fills the gap between the flip chip 40 and the substrate 14 thereby preventing corrosion of the electrical contacts. The underfill component also encapsulates the interconnections between the solder balls 42 and the solder pads 16, protecting them from moisture and providing some thermal stress relief.

Figure 5:
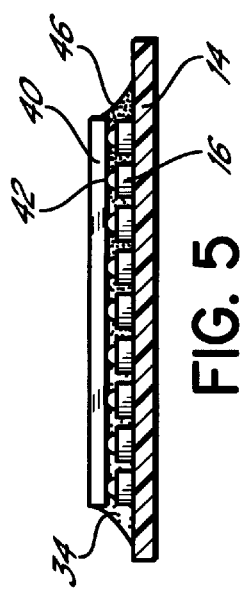
FIG. 5 is an elevational view of the substrate of FIG. 4 with the flip chip mechanically and electrically connected to the substrate.

With reference to FIG. 5, the flip chip 40 and substrate 14 are illustrated after the heating cycle. The solder balls 42 are no longer spherical, but have a flat side where they contact the solder pads 16. The underfill material 34 has a smooth radius 46 between the edge of the flip chip 40 and the surface of the substrate 14. This radius 46 provides added protection to the solder balls 42 and the solder pads 16 from external contamination as well as the edge of the flip chip itself.

The underfill dispensing method of the present invention provides advantages relative to other dispensing methods such as those using a needle dispense apparatus. For example, the dispensing method using the needle dispense apparatus offers little, if any, height tailoring while depositing the underfill mixture onto the substrate 14. Also, with the three-dimensional tailoring of the present invention, a precise amount of underfill can be applied to minimize excess underfill which may squeeze out between the flip chip 40 and the substrate 14. Another problem with the dispensing method using a needle dispense apparatus is undesirable stringing of the underfill material at various stages of its application. Stringing is completely avoided with the dispensing method of the present invention using the dispensing apparatus 10 described above.

Another drawback of the dispensing method using a needle dispense apparatus is its need to physically contact the surface of the substrate during underfill deposition. The dispensing apparatus 10 used in the dispensing method of the present invention can apply the underfill material without ever contacting the substrate 14. In contrast, the typical needle dispense apparatus must operate very close to the surface of the substrate 14 to provide a continuous bead of material from the needle tip to the surface of the substrate 14. To control the height of the needle tip relative to the surface of the substrate 14, a height sensor must be employed. This height sensor generally has a probe which must press down upon the surface to determine the height of the needle tip relative to the surface of the substrate 14. Consequently, as the needle tip moves relative to the substrate during underfill deposition, the height sensor travels across the surface of the substrate 14 in positive contact therewith. This contact with the substrate 14 may damage the substrate 14. In accordance with the principles of the present invention, the dispensing apparatus 10 does not require a height sensor so no contact with the substrate 14 ever occurs. Accordingly, the method of the present invention does not inflict damage to the substrate 14.

While the present invention has been illustrated by a description of various preferred embodiments and while these embodiments have been described in considerable detail in order to describe the best mode of practicing the invention, it is not the intention of applicant to restrict or in any way limit the scope of the appended claims to such detail. Additional advantages and modifications within the spirit and scope of the invention will readily appear to those skilled in the art. The invention itself should only be defined by the appended claims, wherein I claim:

1. A method for filling a space between a flip chip and a substrate with no-flow flux and underfill material using a dispensing apparatus configured to dispense droplets of the no-flow flux and underfill material onto the substrate, the method comprising:

spacing the dispensing apparatus away from the substrate so that the dispenser outlet does not contact the substrate;

dispensing at least one droplet of no-flow flux and underfill material from the dispenser outlet onto the substrate;

moving the dispensing apparatus relative to the substrate;

forming a predetermined pattern of droplets on the substrate by repeating the dispensing and moving steps; and placing a flip chip in contact with the pattern of droplets and the substrate to uniformly fill the space between the flip chip and the substrate with the no-flow flux and underfill material.

2. The method of claim 1, wherein forming a predetermined pattern of droplets further comprises forming a pattern including a plurality of radially extending arms.

3. The method of claim 2, wherein forming a pattern including a plurality of radially extending arms further comprises forming a substantially X-shaped pattern on the substrate.

4. The method of claim 3, further comprising:

forming additional radially extending arms between the radially extending arms forming the X-shaped pattern on the substrate.

5. The method of claim 3, further comprising:

forming the X-shaped pattern with a contoured profile of varying height.

6. The method of claim 5, further comprising:

forming the contoured profile with a maximum height relative to the substrate at the center of the X-shaped pattern and a continually decreasing height from the maximum height along the length of each radially extending arm.

7. The method of claim 1, further comprising:

forming the predetermined pattern with a contoured profile of varying height.

8. The method of claim 7, further comprising:

forming the contoured profile with a maximum height relative to the substrate at the center of the predetermined pattern and a continually decreasing height in a generally radially outward direction.

9. A method for filling a space between a flip chip and a substrate with no-flow flux and underfill material using a dispensing apparatus configured to dispense droplets of the no-flow flux and underfill material onto the substrate, the method comprising:

spacing the dispensing apparatus away from the substrate so that the dispenser outlet does not contact the substrate;

dispensing droplets of no-flow flux and underfill material from the dispenser outlet onto the substrate at an X-Y coordinate until the droplets collectively reach a desired height relative to the substrate;

moving the dispensing apparatus relative to the substrate to another X-Y coordinate;

forming a predetermined pattern of droplets on the substrate by repeating the dispensing and moving steps; and placing a flip chip in contact with the pattern of droplets and the substrate to uniformly fill the space between the flip chip and the substrate with the no-flow flux and underfill material.

* * * * *